(12) United States Patent
Xu (10) Patent No.: US 9,494,719 B2
(45) Date of Patent: Nov. 15, 2016

(54) COLOR FILTER AND METHOD OF MAKING THE SAME

(71) Applicant: Shenzhen China Star Optoelectronics Technology Co., Ltd., Guangdong (CN)

(72) Inventor: Xiangyang Xu, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 74 days.

(21) Appl. No.: 14/384,388

(22) PCT Filed: May 6, 2014

(86) PCT No.: PCT/CN2014/077026
§ 371 (c)(1),
(2) Date: Sep. 11, 2014

(87) PCT Pub. No.: WO2015/168900
PCT Pub. Date: Nov. 12, 2015

(65) Prior Publication Data
US 2015/0316843 A1    Nov. 5, 2015

(30) Foreign Application Priority Data

May 4, 2014  (CN) .......................... 2014 1 0184693

(51) Int. Cl.
| | | |
|---|---|---|
| *G03F 7/20* | (2006.01) | |
| *G02B 5/20* | (2006.01) | |
| *G03F 7/00* | (2006.01) | |
| *G02B 5/22* | (2006.01) | |

(52) U.S. Cl.
CPC ................. *G02B 5/201* (2013.01); *G02B 5/22* (2013.01); *G02B 5/223* (2013.01); *G03F 7/00* (2013.01); *G03F 7/0007* (2013.01)

(58) Field of Classification Search
CPC . G03F 7/0007; G03F 1/133516; G02B 5/20; G02B 5/22; G02B 5/223; G02B 5/201
USPC ............................................................ 430/7
See application file for complete search history.

(56) References Cited

U.S. PATENT DOCUMENTS

| | | | | |
|---|---|---|---|---|
| 6,606,137 B2* | 8/2003 | Lee | .................... | G02F 1/133516 349/106 |
| 2005/0221205 A1* | 10/2005 | Kim | ...................... | G03F 7/0007 430/7 |
| 2007/0148565 A1* | 6/2007 | Tsai | ........................ | G02B 5/201 430/7 |
| 2012/0308919 A1* | 12/2012 | Chen | ...................... | G02B 5/201 430/5 |

* cited by examiner

*Primary Examiner* — John A McPherson (57) ABSTRACT

A color filter and a method of making the same are disclosed. The method for fabricating a color filter has the steps of: providing a substrate; forming a black matrix layer on the substrate; using a mask to form at least one first light-filtering pattern on the substrate provided with the black matrix layer; using the mask to form at least one second light-filtering pattern on the substrate provided with the black matrix layer and the first light-filtering pattern; using the mask to form at least one third light-filtering pattern on the substrate provided with the black matrix layer, the first light-filtering pattern and the second light-filtering pattern, wherein the mask has different transmission spectra corresponding to the first light-filtering pattern, the second light-filtering pattern and the third light-filtering pattern, respectively.

17 Claims, 7 Drawing Sheets

FIG. 1

Prior Art

FIG. 2

Prior Art

FIG. 3

Prior Art

COLOR FILTER AND METHOD OF MAKING THE SAME

This application is a National Phase of PCT Patent Application No. PCT/CN2014/077026 having International filing date of May 6, 2014, which claims the benefit of priority of Chinese Patent Application No. 201410184693.4 filed on May 4, 2014. The contents of the above applications are all incorporated by reference as if fully set forth herein in their entirety.

FIELD OF THE INVENTION

The present invention relates to a color filter and a method of making the same, and in particular, it relates to a method for fabricating a color filter having a trichromatic light-filtering layer having red (R), green (G) and blue (B) by sharing the same mask.

BACKGROUND OF THE INVENTION

Liquid crystal display devices are widely being applied in our daily lives and work, in which a liquid crystal panel is significantly relevant to a display effect of each of the liquid crystal display devices, including its viewing angle, brightness degrees, colors and so on.

A production process of the mainstream thin film transistor liquid crystal device (TFT-LCD) is primarily implemented by exposures and masks. A liquid crystal display device is a passive matrix light-emitting device, which comprises a color filter substrate and a thin film transistor array substrate. Although a color film on array (COA) design has been developed in recent years, the production process of the COA is more complicated and has a lower yield. Therefore, a structure of separating the color filter substrate from the thin film transistor array substrate is still dominating the mainstream technology in the LCD field.

The thin film transistor array substrate primarily comprises a data line, a scan line, a thin film transistor switch, a pixel electrode, a peripheral circuit and so forth; while the color filter substrate comprises a black matrix (BM), and a trichromatic light-filtering layer having red (R), green (G) and blue (B). Since the alignment state of liquid crystal molecules in the liquid crystal display are controlled by changing a voltage driving an integrated chip, with determination of switching a backlight source, different colored lights are formed through the light-filtering layers so that different colors are formed therefrom to make the liquid crystal display rendering vivid and bright frames. Thus, the color filter is a critical component of the liquid crystal display.

Fabricating a conventional color filter requires at least five masks as following steps of: forming black matrices by sputtering a resin layer on a glass substrate; forming a red light-filtering pattern on an opening portion between the black matrices; repeating the above steps to sequentially form a green light-filtering pattern and a blue light-filtering pattern; and finally forming a photo spacer (PS) layer. Moreover, a multi-domain vertical alignment (MVA) LCD is accomplished with needs of using six masks in: forming the black matrices; forming a red light-filtering pattern; forming a green light-filtering pattern; forming a blue light-filtering pattern; forming a common electrode layer; and forming a photo spacer layer.

Figure 1:
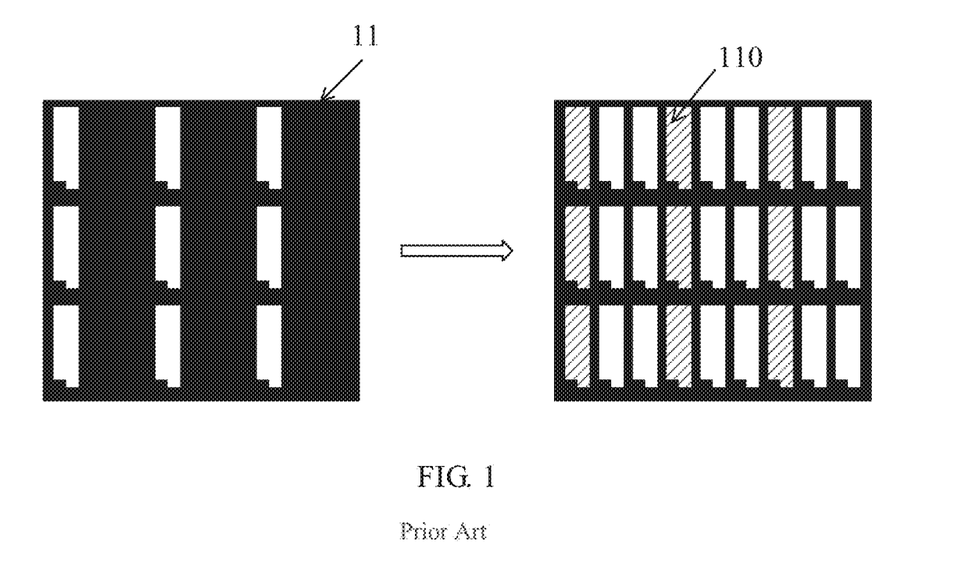
FIG. 1 is a schematic diagram for fabricating the first light-filtering pattern in the prior art.
Figure 2:
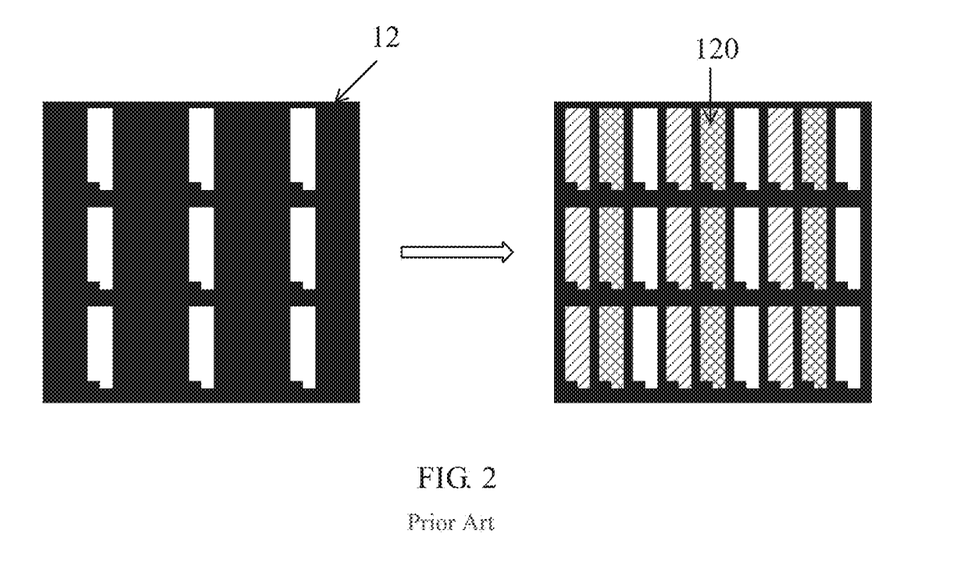
FIG. 2 is a schematic diagram for fabricating the second light-filtering pattern in the prior art.
Figure 3:
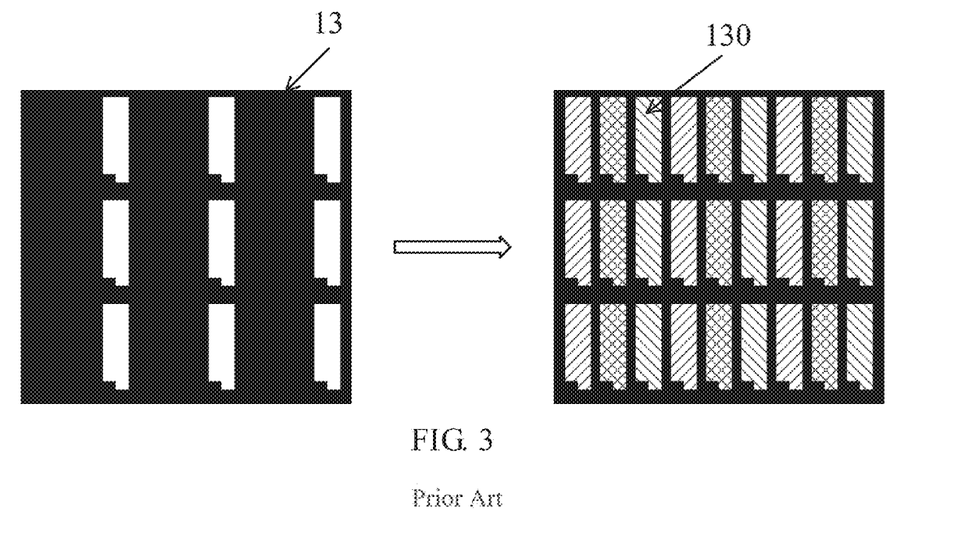
FIG. 3 is a schematic diagram for fabricating the third light-filtering pattern in the prior art.

Meanwhile, to accomplish the red light-filtering pattern, the green light-filtering pattern and the blue light-filtering pattern, using three different masks is essential as well as sequentially executing three exposures and three developments. As shown in FIG. 1 to FIG. 3, a first mask 11 is used to form a red light-filtering pattern 110. After that, a second mask 12 is used to form a green light-filtering pattern 120. Then a third mask 13 is used to form a blue light-filtering pattern 130. Since in the conventional art the red light-filtering pattern, the green light-filtering and the blue light-filtering must be formed by three different masks, this would cost higher and take longtime. Therefore, it is necessary to provide a method for fabricating a color filter substrate in order to solve the problems of the prior art.

SUMMARY OF THE INVENTION

Accordingly, an objective of the present invention is to provide a color filter and a method of making the same, where specially a method for fabricating a trichromatic light-filtering layer having red (R), green (G) and blue (B) by sharing the same mask is provided.

To achieve the objective of the present invention, a method for fabricating a color filter is provided as the following steps of: providing a substrate; forming a black matrix layer on the substrate; coating a first photoresist material on the substrate provided with the black matrix layer; forming at least one first light-filtering pattern through the mask by ultraviolet exposure and developing the substrate coated with the first photoresist material which has a photosensitive frequency in a transmission spectrum range of the mask corresponding to the first light-filtering pattern; coating a second photoresist material on the substrate provided with the black matrix layer and the first light-filtering pattern; and forming at least one second light-filtering pattern through the mask by ultraviolet exposure and developing the substrate coated with the second photoresist material which has a photosensitive frequency in a transmission spectrum range of the mask corresponding to the second light-filtering pattern; coating a third photoresist material on the substrate provided with the black matrix layer, the first light-filtering pattern and the second light-filtering pattern; and forming at least one third light-filtering pattern through the mask by ultraviolet exposure and developing the substrate coated with the third photoresist material which has a photosensitive frequency in a transmission spectrum range of the mask corresponding to the third light-filtering pattern.

According to another aspect of the present invention, a method for fabricating a color filter is provided as the following steps of: providing a substrate; forming a black matrix layer on the substrate; using a mask to form at least one first light-filtering pattern on the substrate provided with the black matrix layer; using the mask to form at least one second light-filtering pattern on the substrate provided with the black matrix layer and the first light-filtering pattern; using the mask to form at least one third light-filtering pattern on the substrate provided with the black matrix layer, the first light-filtering pattern and the second light-filtering pattern; wherein the mask has different transmission spectra respectively corresponding to the first light-filtering pattern, the second light-filtering pattern and the third light-filtering pattern.

In one embodiment of the present invention, the method for fabricating the color filter may further comprises: forming a protective layer on the substrate provided with the black matrix layer, the first light-filtering pattern, the second light-filtering pattern and the third light-filtering pattern;

forming a common electrode layer on the protective layer; and forming a photo spacer layer on the common electrode layer.

A feature of the present invention is that the first light-filtering pattern, the second light-filtering pattern and the third light-filtering pattern represent different colors and are disposed parallel with each other on the substrate, wherein the step of using a mask to form at least one first light-filtering pattern on the substrate provided with the black matrix layer further comprises: rinsing the substrate provided with the black matrix layer; coating a first photoresist material on the substrate after rinsing, wherein the first photoresist material has a photosensitive frequency in a transmission spectrum range of the mask corresponding to the first light-filtering pattern; and forming the first light-filtering pattern by ultraviolet exposure and developing the substrate coated with the first photoresist material.

Subsequently, the step of using the mask to form at least one second light-filtering pattern on the substrate provided with the black matrix layer and the first light-filtering pattern further comprises: rinsing the substrate provided with the black matrix layer and the first light-filtering pattern; coating a second photoresist material on the substrate after rinsing, wherein the second photoresist material has a photosensitive frequency in a transmission spectrum range of the mask corresponding to the second light-filtering pattern; and forming the second light-filtering pattern by ultraviolet exposure and developing the substrate coated with the second photoresist material.

The step of using the mask to form at least one third light-filtering pattern on the substrate provided with the black matrix layer, the first light-filtering pattern and the second light-filtering pattern further comprises: rinsing the substrate provided with the black matrix layer, the first light-filtering pattern and the second light-filtering pattern; coating a third photoresist material on the substrate after rinsing, wherein the third photoresist material has and a photosensitive frequency in a transmission spectrum range of the mask corresponding to the third light-filtering pattern; and forming the third light-filtering pattern by ultraviolet exposure and developing the substrate coated with the third photoresist material.

The first photoresist material, the second photoresist material and the third photoresist material are organic negative-type photoresists.

The first light-filtering pattern, the second light-filtering pattern and the third light-filtering pattern are red, green and blue light-filtering patterns, respectively.

In one embodiment of the present invention, a color filter fabricated by the above described method comprises: a substrate; a plurality of black matrices disposed on the substrate; and a plurality of light-filtering patterns with different colors disposed parallel with each other on the substrate, each of which is disposed between two adjacent black matrices.

In another embodiment of the present invention, the color filter may further comprises: a protective layer disposed on the plurality of black matrices and the plurality of light-filtering patterns with different colors; a common electrode layer disposed on the protective layer; and a photo spacer layer disposed on the common electrode layer.

Since in the present invention, the photosensitive frequencies of the first photoresist material, the second photoresist material and the third photoresist material are selected based on different transmission spectra of the mask corresponding to the first light-filtering pattern, the second light-filtering pattern and the third light-filtering pattern, the first light-filtering pattern, the second light-filtering pattern and the third light-filtering pattern can share the same mask. Therefore, the two pieces of masks can be reduced, the production process can be simplified, and the production cost of the liquid crystal display device can be reduced.

For a better understanding of the aforementioned content of the present invention, preferable embodiments are illustrated in accordance with the attached figures as follows:

DETAILED DESCRIPTION OF THE PREFERRED EMBODIMENTS

The following descriptions of the respective embodiments are specific embodiments capable of being implemented as illustrations of the present invention, with reference to the appended figures. The terms up, down, front, rear, left, right, interior, exterior, side, etcetera are merely directions referring to the appended figures. Therefore, such directions are employed for explaining and understanding the present invention, but are not limitations thereto.

Figure 4:
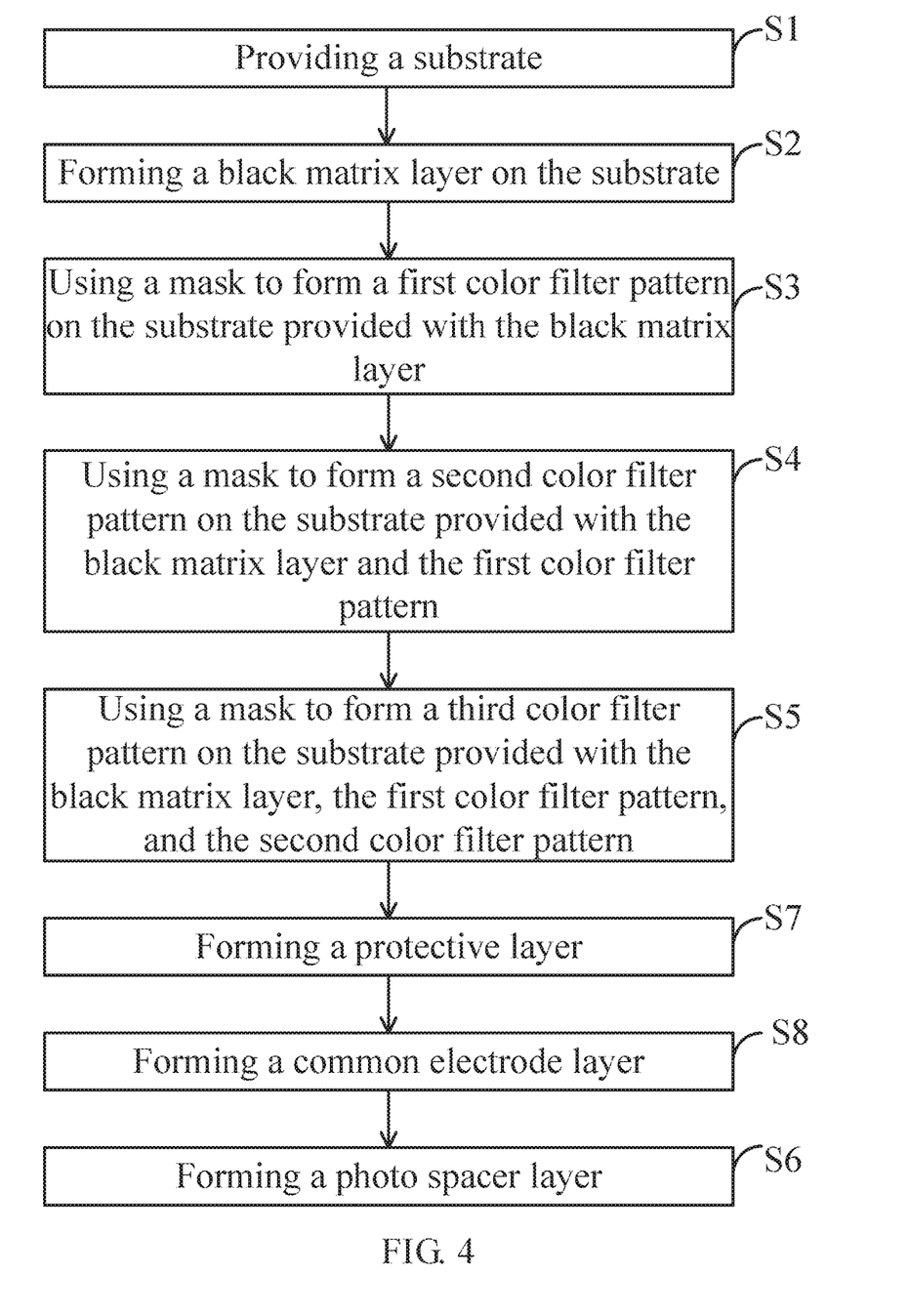
FIG. 4 is a flowchart for fabricating a color filter according to the present invention.

FIG. 4 is a method flowchart for fabricating a color filter according to a first preferred embodiment of the present invention. In the present embodiment, the color filter 10 can be formed by a pigment dispersion method substantially including the following steps.

Step S1: providing a substrate 50 which is a transparent glass substrate.

Figure 5:
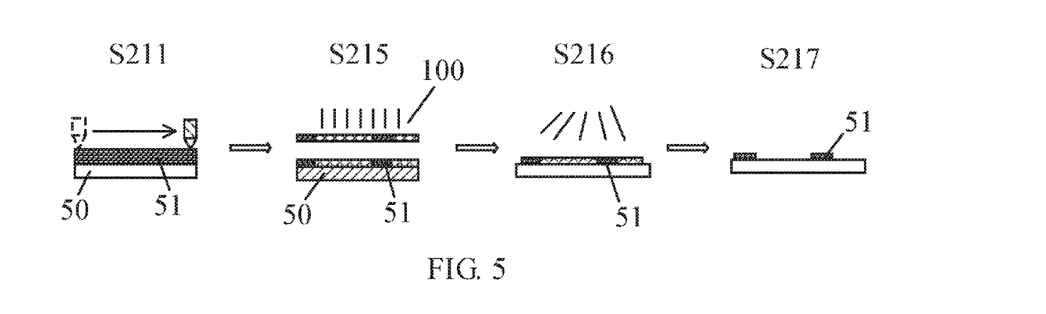
FIG. 5 is a schematic diagram for fabricating a black matrix according to the present invention.

Step S2: referring to FIG. 5, forming a black matrix 51 layer on the substrate 50 by the substantial steps further comprising: step S211, coating an organic black negative-type photoresist material 51 on the substrate 50 by spin coater or slit coater; step S212, drying the organic black negative-type photoresist material 51 by vacuum drier; step S213, removing the edge photoresist of the dried substrate 50 by edge bead rinse (EBR); step S214, pre-baking and cooling the substrate 50; step S215, disposing a mask with a black matrix pattern on the organic black negative-type photoresist material 51 and exposing the organic black negative-type photoresist material 51 by an ultraviolet exposure machine; step S216, developing the organic black negative-type photoresist material 51 by a developer and then etching the organic black negative-type photoresist material 51; and step S217, baking and curing the substrate 50 to form a plurality of black matrix layers 51.

In said step S2, the black matrix layer 51 can be selected form different materials, including, for example, coating a positive-type photosensitive material on chromium or alloy thereof. Thus, the step S2 can also be accomplished by the following steps: Step S221, forming a chromium thin film or a chromium-alloy thin film on the substrate by vapor deposition or sputtering; Step S222, coating a positive-type photoresist material on the surface of the thin film; step S223, disposing a mask with a black matrix pattern on the positive-type photoresist material and exposing the positive-type photoresist material 51 by an ultraviolet exposure machine; step S224, developing the positive photoresist material by a developer and etching the positive-type photoresist material to remove an exposed portion of the chromium thin film or the chromium-alloy thin film; and step S225, removing the positive-type photoresist material completely by a remover so as to form the black matrix layer 51 of the chromium or chromium-alloy.

It should be understood that the step S2 can also adopt an organic black positive-type photoresist material, or coating a negative-type photoresist material on the chromium or alloy thereof. Excepting that the material of the exposed portion in the step S215 or S223 is insoluble (as a negative-type photoresist material) or soluble (as a positive-type photoresist material), the implementation of the present invention will not be therefore affected.

Figure 6:
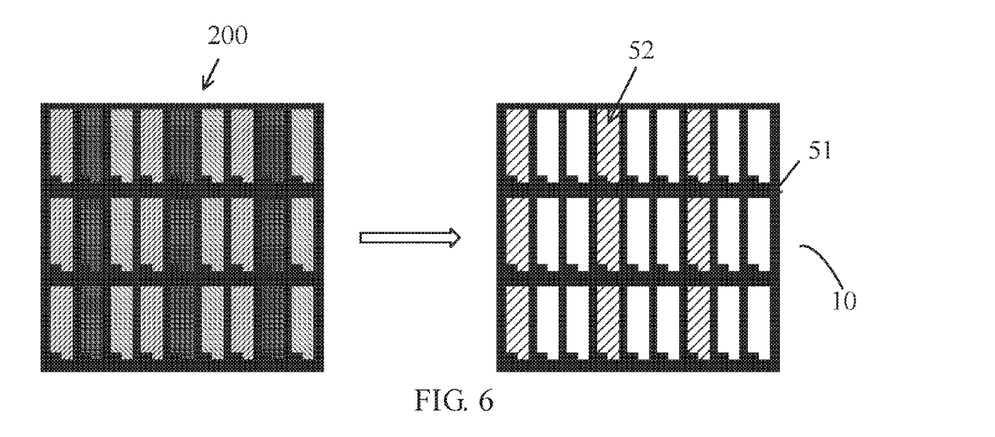
FIG. 6 is a schematic diagram for fabricating a first light-filtering pattern according to the present invention.

Step S3: using a mask 200 to form a first light-filtering pattern 52 on the substrate 50 provided with the black matrix layer 51 by the substantial steps comprising: step S31, rinsing the substrate 50 provided with the black matrix layer 51, and coating a first photoresist material 52 on the substrate 50 after rinsing, wherein the first photoresist material 52 has a photosensitive frequency in a transmission spectrum range of the mask corresponding to the first light-filtering pattern 52; step S32, forming the first light-filtering pattern 52 by performing sequence steps of: vacuum drying, removing the photoresist edge, pre-baking, cooling, ultraviolet exposure, development and curing. Referring to FIG. 6, since the first photoresist material 52 is selected based on the transmission spectrum of the mask corresponding to the first light-filtering pattern 52, when the mask 200 is disposed above the first photoresist material 52, the first light-filtering pattern 52 can be formed by exposing the first photoresist material 52 according to the photosensitive frequency of the first photoresist material 52. The first light-filtering pattern 52 is a red light-filtering pattern.

Figure 7:
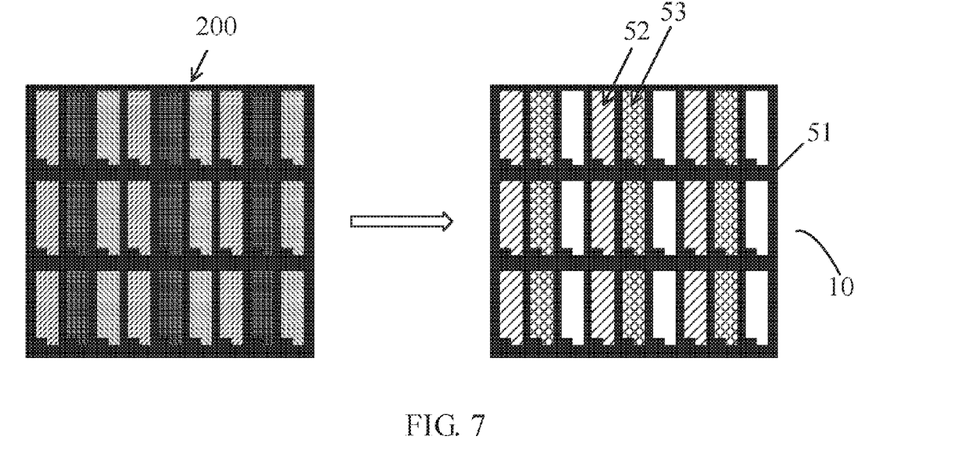
FIG. 7 is a schematic diagram for fabricating a second light-filtering pattern according to the present invention.

Step S4: using a mask 200 to form a second light-filtering pattern 53 on the substrate 50 provided with the black matrix layer 51 and the first light-filtering pattern 52 by the substantial steps comprising: step S41, rinsing the substrate 50 provided with the black matrix layer 51 and the first light-filtering pattern 52, and coating a second photoresist material 53 on the substrate 50 after rinsing, wherein the second photoresist material 53 has a photosensitive frequency in a transmission spectrum range of the mask corresponding to the second light-filtering pattern 53; step S42, forming the second light-filtering pattern 53 by performing sequence steps of: vacuum drying, removing the photoresist edge, pre-baking, cooling, ultraviolet exposure, development and curing. Referring to FIG. 7, since the second photoresist material 53 is selected based on the transmission spectrum of the mask corresponding to the second light-filtering pattern 53, when the mask 200 is disposed above the second photoresist material 53, the second light-filtering pattern 53 can be formed by exposing the second photoresist material 53 according to the photosensitive frequency of the second photoresist material 53. The second light-filtering pattern 53 is a green light-filtering pattern.

Figure 8:
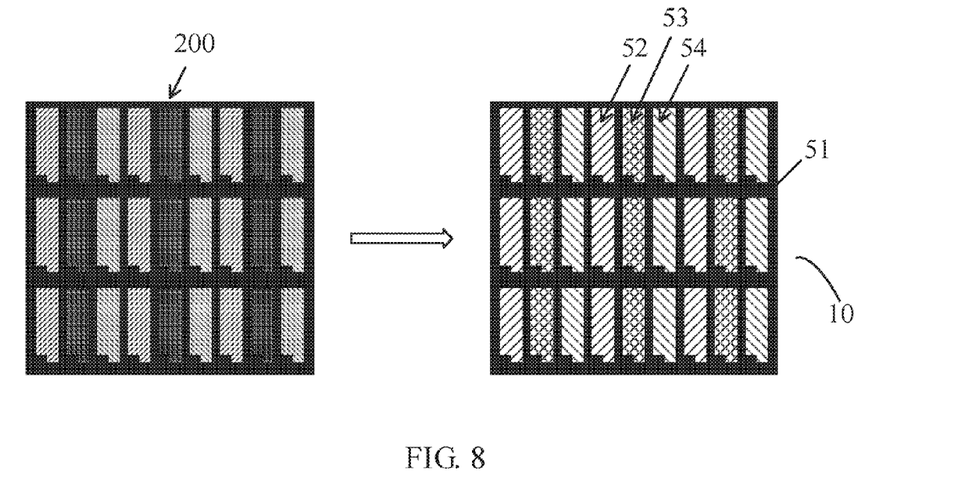
FIG. 8 is a schematic diagram for fabricating a third light-filtering pattern according to the present invention.

Step S5: using the mask 200 to form a third light-filtering pattern 54 on the substrate 50 provided with the black matrix layer 51, the first light-filtering pattern 52 and the second light-filtering pattern 53 by the substantial steps comprising: step S51, rinsing the substrate 50 provided with the black matrix layer 51, the first light-filtering pattern 52 and the second light-filtering pattern 53, and coating a third photoresist material 54 on the substrate 50 after rinsing, wherein the third photoresist material 54 has a photosensitive frequency in a transmission spectrum range of the mask corresponding to the third light-filtering pattern 54; step S52, forming the third light-filtering pattern 54 by performing sequence steps of: vacuum drying, removing the photoresist edge, pre-baking, cooling, ultraviolet exposure, development and curing. Referring to FIG. 8, since the third photoresist material 54 is selected based on the transmission spectrum of the mask corresponding to the third light-filtering pattern 54, when the mask 200 is disposed above the third photoresist material 54, the third light-filtering pattern 54 can be formed by exposing the third photoresist material 54 according to the photosensitive frequency of the third photoresist material 54. The third light-filtering pattern 54 is a blue light-filtering pattern.

It should be particularly noted that from steps S3 to S5 the mask provides different ultraviolet transmission spectra, so as to form the first light-filtering pattern, the second light-filtering pattern and the third light-filtering pattern on the substrate, respectively. The first light-filtering pattern, the second light-filtering pattern and the third light-filtering pattern have different colors and are disposed parallel with each other on the substrate.

Figure 9:
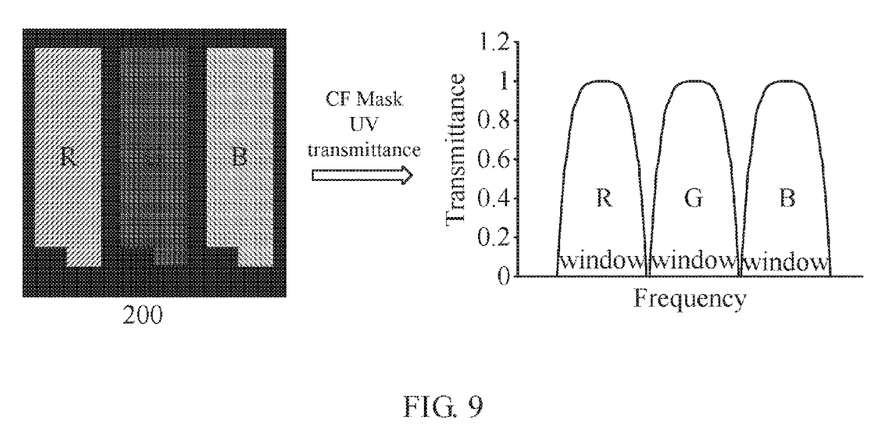
FIG. 9 is a diagram of the ultraviolet transmittance spectrums of the first light-filtering pattern, the second light-filtering pattern and the third light-filtering pattern.
Figure 10:
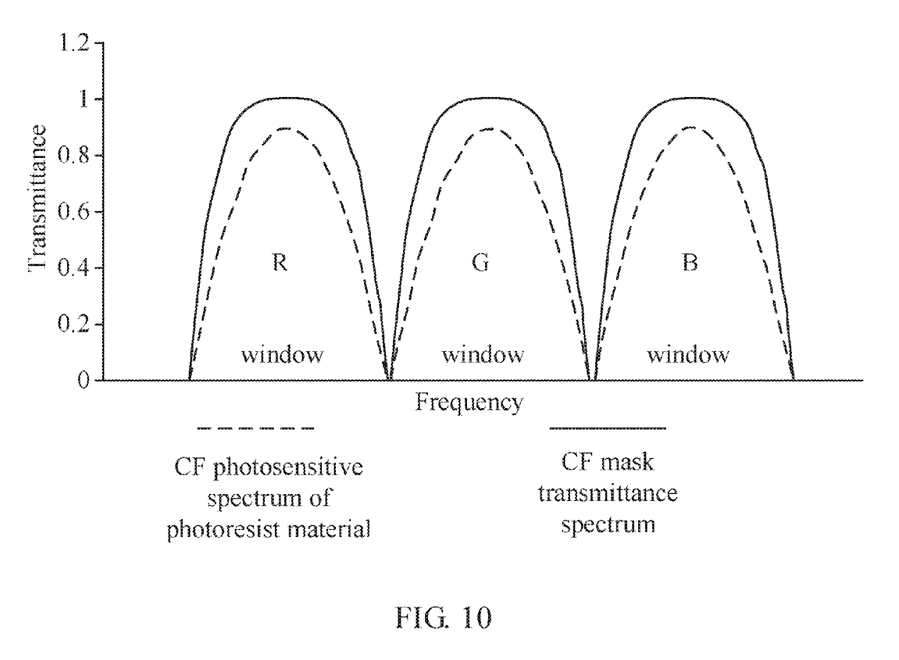
FIG. 10 is diagram showing the photosensitive frequencies of the first light-filtering pattern, the second light-filtering pattern and the third light-filtering pattern.

As shown in FIG. 9 wherein the mask 200 shared by the first light-filtering pattern 52, the second light-filtering pattern 53 and the third light-filtering pattern 54 has different ultraviolet transmittance spectra respectively corresponding to the portions of the first light-filtering pattern 52, the second light-filtering pattern 53 and the third light-filtering pattern 54, so as to select the first photoresist material 52, the second photoresist material 53 and the third photoresist material 54 bases on the different transmittance spectra of the mask respectively corresponding to the first light-filtering pattern 52, the second light-filtering pattern 53 and the third light-filtering pattern 54. After the photoresist materials are selected, the photosensitive frequencies can thereof be determined. Thus, the first light-filtering pattern 52, the second light-filtering pattern 53 and the third light-filtering pattern 54 can be formed by adopting the same mask. As shown in FIG. 10, dotted lines represent the photosensitive frequencies of the first photoresist material 52, the second photoresist material 53 and the third frequency 54. Since the present invention only adopts one mask to complete the first light-filtering pattern 52, the second light-filtering pattern 53 and the third light-filtering pattern 54, there is no need to use different masks to complete the light-filtering patterns as there is in the prior art. Thus, the number of masks can be reduced by two, the production process of the color filter can be simplified, and the production cost can be reduced at the same time.

The second preferred embodiment for fabricating the color filter of the present invention may further comprises: step S6, forming a photo spacer layer 55 on the black matrix layer 51, the first light-filtering pattern 52, the second light-filtering pattern 53 and the third light-filtering pattern 54. The main function of the photo spacer layer 55 is to support two glass substrates and maintain the spacing uniformity of liquid crystal layer. The substantial step S6 comprises: rinsing the substrate; coating a positive-type photoresist; vacuum drying; removing the photoresist edge; pre-baking and cooling; ultraviolet exposure; development and baking. Or the step S6 may further comprises step S7 between steps S5 and S6, for example: coating a protective layer 56 on the substrate provided with the black matrix layer 51, the first light-filtering pattern 52, the second light-filtering pattern 53 and the third color filter 54 by spin coating or slit coating, so as to protect the light-filtering patterns and increase their surface smoothness. After that, performing step S8 by: forming a common electrode layer 57 on the protect layer 56 by vacuum sputtering, so as to produce a positive and negative polarity with liquid crystal pattern electrodes to drive the liquid crystal molecules. The steps S7 and S8 can also be simultaneously performed, that is, simultaneously forming the protect layer 56 and the common electrode layer 57 on the substrate 50, so as to cover the black matrix layer 51, the first light-filtering pattern 52, the second light-filtering pattern 53 and the third light-filtering pattern 54.

Figure 11:
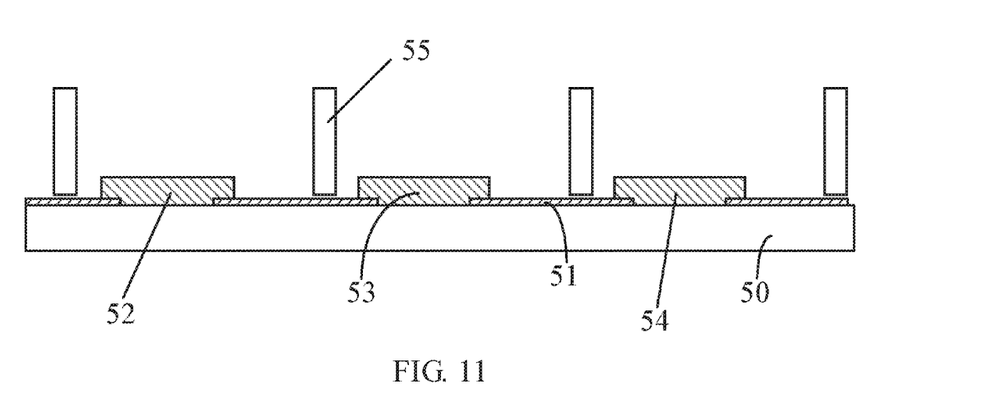
FIG. 11 is a structural cross-section diagram of the color filter according to a preferred embodiment of the present invention.

Referring to FIG. 11, another preferred embodiment of the present invention provides a color filter 10 fabricated by the above described method, comprising: a substrate 50; a plurality of black matrices 51 disposed on the substrate; a plurality of light-filtering patterns with different colors 52, 53, 54 disposed parallel with each other on the substrate 50, and each of which is disposed between two adjacent black matrices 51. Also, the color filter may further includes a photo spacer layer 55 disposed on the plurality of black matrices 51 and the plurality of different light-filtering patterns with different colors 52, 53, 54.

Figure 12:
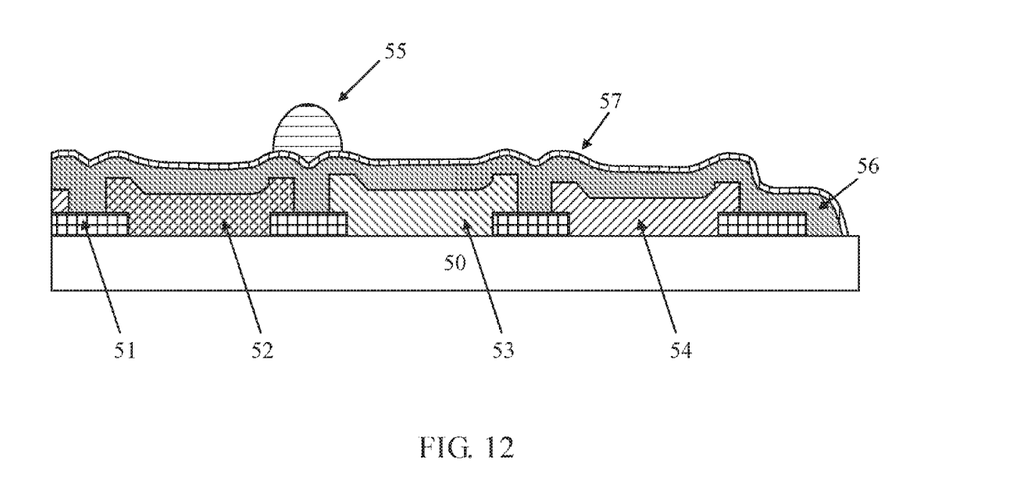
FIG. 12 is a structural cross-section diagram of the color filter according to another preferred embodiment of the present invention.

Referring to FIG. 12, in another embodiment of the present invention, the color filter 10 may further comprises: a protective layer 56 disposed on the plurality of black matrices 51 and the plurality of light-filtering patterns with different colors 52 53, 54, and moreover disposed below the photo spacer layer 55; and a common electrode layer 57 disposed between the protective layer 56 and the photo spacer layer 55. Wherein, the substrate 50 is a transparent glass substrate, and its thickness can be selected from 0.7 mm or less, but is not limited thereto.

Because an amorphous silicon of a TFT semiconductor has photoconductivity, in order to maintain the non-conduction state between a drain electrode and a source electrode, the black matrix 51 must be able to shield the external light and prevent the photoelectron flow of the TFT. The black matrix may comprises the functions of improving the color contrast ratio and preventing color mixing from the plurality of adjacent light-filtering patterns with different colors 52, 53, 54. To achieve the foregoing objects, the black matrix 51 requires low reflectivity, and more than three times the optical concentration for the light-shielding rate. The thickness of the black matrix 51 is preferably selected from 1 µm or less, but not limited thereto.

When the photoresist material of the plurality of light-filtering patterns with different colors 52, 53, 54 accept a certain wavelength of light or radiation, corresponding photochemical reactions or incentive will occur. The photoresist material is a photosensitive liquid mixed with three major components of the photosensitive resin, photo initiator, and solvent. After the photosensitive resin is illuminated by light, a curing reaction can occur very quickly in the exposure zone, such that the physical properties of the photoresist material, especially the solubility and the affinity, will significant change. The photoresist material has high color purity, high light transmittance, high optical properties, and high heat resistance, and its thickness may be selected from the rage of 1 µm to 2 µm, but is not limited thereto.

According to the principle of the chemical reaction mechanism and the development thereof, the photoresist material can be divided into a negative-type photoresist material and a positive-type photoresist material. When an insoluble material is formed after being light illuminated, the photoresist material is regarded as a negative-type photoresist material; conversely, an insoluble solvent which becomes a soluble substance after being light illuminated is regarded as a positive-type photoresist material. The first photoresist material 52, the second photoresist material 53 and the third photoresist material 54 of the present invention are preferably adopting an organic negative-type photoresist material.

Furthermore, the protective layer 56 can be selected form epoxy resin, polyimide-based resin, polyvinyl alcohol resin or acrylic resin based polymers, the thickness of the protective layer 56 may selected from the range of 2 µm to 2.5 µm, but is not limited thereto.

The common electrode layer 57 may be a transparent conductive layer or a metal conductive layer having a thickness selected to be around 0.15 µm, but is not limited thereto. For the transparent conductive layer, an indium tin oxide (ITO) thin film can be used; while aluminum can be selected as the conduct material for the metal conductive layer. However, since the ITO has the advantages of high conductivity ($1{\sim}5{\times}10{-}6$ Ωm), high transparency and high weatherability, the transparent conductive layer is preferably selected for the common electrode 57.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A method for fabricating a color filter, comprising the steps of:

providing a substrate;

forming a black matrix layer on the substrate;

coating a first photoresist material on the substrate provided with the black matrix layer, and forming at least one first light-filtering pattern through a mask by ultraviolet exposure and developing the substrate coated with the first photoresist material which has a photosensitive frequency in a transmission spectrum range of the mask corresponding to the first light-filtering pattern;

coating a second photoresist material on the substrate provided with the black matrix layer and the first light-filtering pattern, and forming at least one second light-filtering pattern through the mask by ultraviolet exposure and developing the substrate coated with the second photoresist material which has a photosensitive frequency in a transmission spectrum range of the mask corresponding to the second light-filtering pattern; and coating a third photoresist material on the substrate provided with the black matrix layer, the first light-filtering pattern and the second light-filtering pattern, and forming at least one third light-filtering pattern through the mask by ultraviolet exposure and developing the substrate coated with the third photoresist material which has a photosensitive frequency in a transmission spectrum range of the mask corresponding to the third light-filtering pattern.

2. A method for fabricating a color filter, comprising the steps of:

providing a substrate;

forming a black matrix layer on the substrate;

using a mask to form at least one first light-filtering pattern on the substrate provided with the black matrix layer;

using the mask to form at least one second light-filtering pattern on the substrate provided with the black matrix layer and the first light-filtering pattern;

using the mask to form at least one third light-filtering pattern on the substrate provided with the black matrix layer, the first light-filtering pattern and the second light-filtering pattern, wherein the mask has different transmission spectra respectively corresponding to the first light-filtering pattern, the second light-filtering pattern and the third light-filtering pattern, wherein the first light-filtering pattern, the second light-filtering pattern and the third light-filtering pattern have different colors and are disposed parallel with each other on the substrate, and the step of using a mask to form at least one first light-filtering pattern on the substrate provided with the black matrix layer comprises:

rinsing the substrate provided with the black matrix layer, and coating a first photoresist material on the substrate after rinsing, the first photoresist material has a photosensitive frequency in a transmission spectrum range of the mask corresponding to the first light-filtering pattern;

forming the first light-filtering pattern through the mask by ultraviolet exposure and developing the substrate coated with the first photoresist material.

3. The method for fabricating a color filter as claimed in claim 2, wherein the step of forming a black matrix layer on the substrate comprises:

coating a black photoresist material on the substrate;

disposing a mask with a black matrix pattern on the black photoresist material, and exposing the black photoresist material by an ultraviolet exposure machine; and forming a plurality of black matrix layers by using a developer developing the black photoresist material and etching the black photoresist material.

4. The method for fabricating a color filter as claimed in claim 3, wherein the first light-filtering pattern, the second light-filtering pattern and the third light-filtering pattern are red, green and blue light-filtering patterns, respectively.

5. The method for fabricating a color filter as claimed in claim 2, wherein the step of forming a black matrix layer on the substrate comprises:

forming a chromium thin film or a chromium-alloy thin film on the substrate by evaporation or sputtering;

coating a black photoresist material on the substrate;

disposing a mask with a black matrix pattern on the black photoresist material, and exposing the black photoresist material by an ultraviolet exposure machine;

developing the black photoresist material by a developer and etching the black photoresist material;

forming a plurality of black matrix layers by stripping the black photoresist material using a stripper.

6. The method for fabricating a color filter as claimed in claim 5, wherein the first light-filtering pattern, the second light-filtering pattern and the third light-filtering pattern are red, green and blue light-filtering patterns, respectively.

7. The method for fabricating a color filter as claimed in claim 2, wherein the step of using the mask to form at least one second light-filtering pattern on the substrate provided with the black matrix layer and the first light-filtering pattern comprises:

rinsing the substrate provided with the black matrix layer and the first light-filtering pattern, and coating a second photoresist material on the substrate after rinsing, the second photoresist material has a photosensitive frequency in a transmission spectrum range of the mask corresponding to the second light-filtering pattern;

forming the second light-filtering pattern through the mask by ultraviolet exposure and developing the substrate coated with the second photoresist material.

8. The method for fabricating a color filter as claimed in claim 7, wherein the first photoresist material, the second photoresist material and the third photoresist material are organic negative-type photoresists.

9. The method for fabricating a color filter as claimed in claim 7, wherein the first light-filtering pattern, the second light-filtering pattern and the third light-filtering pattern are red, green and blue light-filtering patterns, respectively.

10. The method for fabricating a color filter as claimed in claim 2, wherein the step of using the mask to form at least one third light-filtering pattern on the substrate provided with the black matrix layer, the first light-filtering pattern and the second light-filtering pattern comprises:

rinsing the substrate provided with the black matrix layer, the first light-filtering pattern, and the second light-filtering pattern, and coating a third photoresist material on the substrate after rinsing, the third photoresist material has a photosensitive frequency in a transmission spectrum range of the mask corresponding to the third light-filtering pattern;

forming the third light-filtering pattern through the mask by ultraviolet exposure and developing the substrate coated with the third photoresist material.

11. The method for fabricating a color filter as claimed in claim 10, wherein the first photoresist material, the second photoresist material and the third photoresist material are organic negative-type photoresists.

12. The method for fabricating a color filter as claimed in claim 10, wherein the first light-filtering pattern, the second light-filtering pattern and the third light-filtering pattern are red, green and blue light-filtering patterns, respectively.

13. The method for fabricating a color filter as claimed in claim 2, wherein the method further comprises:

forming a protective layer on the substrate provided with the black matrix layer, the first light-filtering pattern, the second light-filtering pattern and the third light-filtering pattern;

forming a common electrode layer on the protective layer; and forming a spacer layer on the common electrode layer.

14. The method for fabricating a color filter as claimed in claim 13, wherein the first light-filtering pattern, the second light-filtering pattern and the third light-filtering pattern are red, green and blue light-filtering patterns, respectively.

15. The method for fabricating a color filter as claimed in claim 2, wherein the first photoresist material, the second photoresist material and the third photoresist material are organic negative-type photoresists.

16. The method for fabricating a color filter as claimed in claim 2, wherein the first light-filtering pattern, the second light-filtering pattern and the third light-filtering pattern are red, green and blue light-filtering patterns, respectively.

17. A color filter fabricated by the method as claimed in claim 2, comprising:
   a substrate;
   a plurality of black matrices disposed on the substrate;
   a plurality of light-filtering patterns with different colors disposed parallel with each other on the substrate, each of which is disposed between two adjacent black matrices.

* * * * *